United States Patent [19]
Kim

[11] Patent Number: 5,846,877
[45] Date of Patent: Dec. 8, 1998

[54] METHOD FOR FABRICATING AN AL-GE ALLOY WIRING OF SEMICONDUCTOR DEVICE

[75] Inventor: Jun-Ki Kim, Seoul, Rep. of Korea

[73] Assignee: LG Semicon Co., Ltd., Choongchungbook-Do, Rep. of Korea

[21] Appl. No.: 569,884

[22] Filed: Dec. 8, 1995

[30] Foreign Application Priority Data

May 27, 1995 [KR] Rep. of Korea .................. 1995 13556

[51] Int. Cl.⁶ ............................................. H01L 21/4763
[52] U.S. Cl. ..................... 438/625; 438/627; 438/629; 438/653; 438/643; 438/660; 438/688
[58] Field of Search .................................. 437/195, 190, 437/194, 197, 200, 201, 187; 438/625, 627, 629, 637, 643, 653, 660, 661, 672, 675, 688

[56] References Cited

U.S. PATENT DOCUMENTS

| | | | |
|---|---|---|---|
| 4,024,567 | 5/1977 | Iwata et al. | 438/688 |
| 4,999,160 | 3/1991 | Lowrey et al. | 437/197 |
| 5,169,803 | 12/1992 | Miyakawa | 437/197 |
| 5,262,354 | 11/1993 | Cote et al. | 437/195 |
| 5,266,521 | 11/1993 | Lee et al. | 437/197 |
| 5,270,255 | 12/1993 | Wong | 437/194 |
| 5,278,449 | 1/1994 | Miyakawa | 257/751 |
| 5,283,206 | 2/1994 | Sugano | 437/197 |
| 5,290,731 | 3/1994 | Sugano et al. | 437/195 |
| 5,308,794 | 5/1994 | Tu | 437/197 |
| 5,314,840 | 5/1994 | Schepis et al. | 437/194 |
| 5,318,923 | 6/1994 | Park | 437/197 |
| 5,356,836 | 10/1994 | Chen et al. | 437/190 |
| 5,374,592 | 12/1994 | MacNaughton et al. | 437/197 |
| 5,395,795 | 3/1995 | Hong et al. | 437/195 |
| 5,397,744 | 3/1995 | Sumi et al. | 437/195 |
| 5,407,863 | 4/1995 | Katsura et al. | 437/197 |
| 5,418,187 | 5/1995 | Miyanaga et al. | 437/195 |
| 5,443,995 | 8/1995 | Nulman | 437/197 |
| 5,485,032 | 1/1996 | Schepis et al. | 257/530 |
| 5,523,259 | 6/1996 | Merchant et al. | 437/190 |
| 5,534,463 | 7/1996 | Lee et al. | 438/688 |

FOREIGN PATENT DOCUMENTS

| | | | |
|---|---|---|---|
| 0032444 | 2/1986 | Japan | 437/197 |
| 0144847 | 7/1986 | Japan | 437/197 |

OTHER PUBLICATIONS

VMIC Conference (1991), pp. 163–169.
IEEE (1994), pp. 5.2.1–5.2.4.

*Primary Examiner*—Charles L. Bowers, Jr.
*Assistant Examiner*—Lynne A. Gurley

[57] ABSTRACT

A method for fabricating wiring of a semiconductor device, which includes a first step for depositing an insulating film on a semiconductor substrate, and forming contact holes by selectively etching the insulating film, a second step for forming a barrier layer on the insulating film and the substrate, a third step for forming a first aluminum alloy layer on the barrier layer, a fourth step for forming a second aluminum alloy layer containing germanium on the first aluminum alloy layer, and a fifth step for forming an aluminum alloy wiring by annealing the substrate on which the first and the second aluminum alloy layers are formed, whereby making it possible to obtain the wiring of a semiconductor device capable of flowing at a low temperature which is the characteristic of Al—Ge wiring and capable of improving the characteristic of the electromigration of the wiring.

16 Claims, 3 Drawing Sheets

METHOD FOR FABRICATING AN AL-GE ALLOY WIRING OF SEMICONDUCTOR DEVICE

BACKGROUND OF THE INVENTION

1. Field of the Invention

The present invention relates to a method for fabricating a wiring of a semiconductor device, and particularly to a method for fabricating the wiring of an ULSI semiconductor device which requires an aluminum flowing process due to the large aspect ratio of the contact hole.

2. Description of the Conventional Art

Referring to FIGS. 1A to 1D, a conventional process for fabricating the wiring of a conventional semiconductor device is shown.

The method for fabricating the wiring of the semiconductor device is described below, referring to the drawings. First, an oxide film used as an insulating film 3 is deposited on a semiconductor substrate, i.e., a silicon substrate 1. After depositing the insulating film 3 on the silicon substrate 1, the part of the insulating film 3 where the semiconductor device is to be formed on the silicon substrate 1, and contact holes are formed by selectively etching the insulating film 3.

Next, as shown in FIG. 1B, in order to prevent a break of the junction formed on the substrate by the diffusion generated between the silicon of the silicon substrate 1 and an aluminum used as a wiring metal, a barrier layer 5 having a metal such as W, TiW, TiN or TiSi2 is formed on the insulating film 3 and the silicon substrate 1. Thereafter, annealing can be performed to strengthen the characteristic of the barrier layer 5 or to reduce the resistance of the contact hole.

As shown in FIG. 1C, an aluminum film 7 for the wiring is deposited on the barrier layer 5 which finishes annealing. At this time, the aluminum flowing process is performed for filling up the contact hole with aluminum.

The aluminum flowing process is performed by two ways. The first method is to flow the aluminum film 7 into the contact hole by depositing the aluminum at a low temperature of below 150° C. and performing the annealing in a chamber of high temperature. The other method is to deposit first the one third (⅓) of the total thickness of the aluminum at a temperature of below 150° C., and to deposit later the remaining two thirds (⅔) of the aluminum at a high temperature.

In result, as shown in FIG. 1D, the wiring process for filling up the contact hole with an aluminum layer 7' is completed.

When performing the aluminum flowing process, in case Al—Cu or Al—Si—Cu which is usually used as a wiring material is selected, the temperature having the wafer temperature of above 450° C. is necessary. While, if an Al—Ge alloy includes aluminum and germanium of 1 to 7 at/o, the temperature is lowered to 300° C., so that the barrier layer for preventing the diffusion of the silicon and the aluminum of the wiring becomes thin.

However, if Al—Ge alloy is used, the characteristic of the electromigration is lessened in a large scale and the reliance of the device drops to a degree as much as pure aluminum.

Recently, to make up for this problem, Al—Cu—Ge which adds Cu to the Al—Ge alloy is used as a wiring material. However, in this case, as the wafer temperature necessary for performing the aluminum flowing process is raised, it is impossible to employ the characteristic of a low temperature, i.e., the merit of using the Al—Ge alloy.

SUMMARY OF THE INVENTION

Therefore, it is an object of the present invention to provide a method for fabricating the wiring of a semiconductor device capable of employing the process at a low temperature, and improving the characteristic of the electromigration of the wiring.

To achieve the above-mentioned object, the method for fabricating the wiring of the semiconductor device in accordance with the first embodiment of the present invention includes a first step of depositing an insulating film on a semiconductor substrate, and forming contact holes by selectively etching the insulating film; a second step of forming a barrier layer on the insulating film and the substrate; a third step of forming a first aluminum alloy layer on the barrier layer; a fourth step of forming a second aluminum alloy layer containing Ge on the first aluminum alloy layer; and a fifth step of forming an aluminum alloy wiring by annealing the substrate on which the first and the second aluminum alloy layers are formed.

On the other hand, the method for fabricating the wiring of the semiconductor device in accordance with the second embodiment of the present invention includes a first step of depositing an insulating film on a semiconductor substrate, and forming contact holes by selectively etching the insulating film; a second step of forming a barrier layer on the insulating film and the substrate; a third step of forming a first aluminum alloy layer on the barrier layer; and a fourth step for raising the temperature by heating the substrate on which the first aluminum alloy layer is formed, forming the second aluminum alloy layer containing Ge at a high temperature, and finishing the process for the aluminium alloy wiring.

BRIEF DESCRIPTION OF DRAWINGS

The above object and advantages of the present invention will be more clearly understood from the following detailed description taken in conjunction with the accompanying drawings, in which.

DETAILED DESCRIPTION OF THE PREFERRED EMBODIMENTS

Referring to FIGS. 2A to 2E, a sequential process for fabricating the wiring of a semiconductor device in accordance with the first embodiment of the present invention is shown. In FIGS. 3A to 3D, a sequential process for fabricating the wiring of the semiconductor device in accordance with the second embodiment of the present invention is shown.

The above-mentioned embodiments are classified by the method for filling up the contact hole by an aluminum flowing process. Referring to FIGS. 2A to 2E, the first embodiment will be described as follows.

Figure 1A:
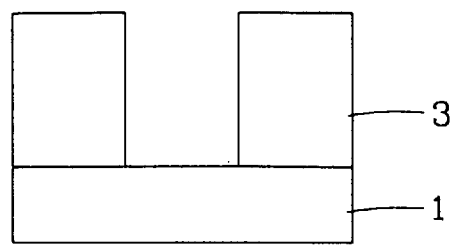
FIGS. 1A to 1D show a conventional process for fabricating the wiring of a conventional semiconductor device.
Figure 1B:
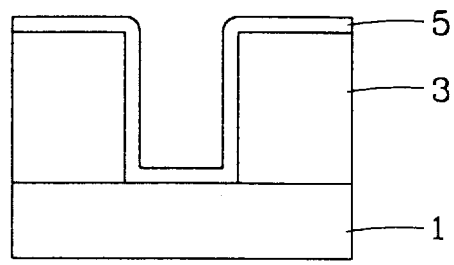
Figure 1C:
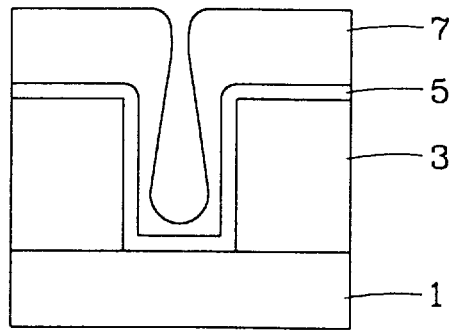
Figure 1D:
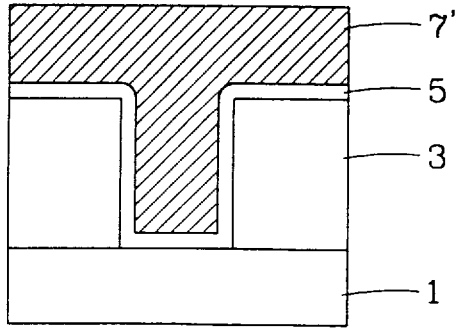
Figure 2A:
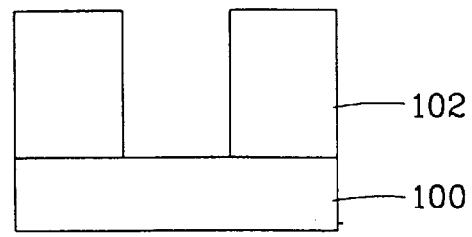
FIGS. 2A to 2E show a sequential process for fabricating the wiring of a semiconductor device in accordance with the first embodiment of the present invention.

First, as shown in FIG. 2A, after depositing an insulating film 102 on a silicon substrate 100, the part of the insulating film 102 where the semiconductor device is to be formed on the silicon substrate 100, and contact holes are formed by selectively etching the insulating film 102.

Figure 2B:
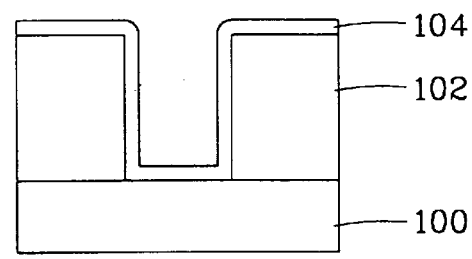

As shown in FIG. 2B, in order to prevent the break of a junction formed on the substrate 100 by the diffusion of an aluminum wiring material and the silicon of the substrate used as a wiring metal, a barrier layer 104 having refractory metal such as TiN, TiW, W or TiSi2, or of their nitride or silicide is formed on the insulating film 102 and the substrate 100. If necessary, the barrier 104 can be heat-treated through the rapid thermal process(RTP) or the furnace.

Figure 2C:
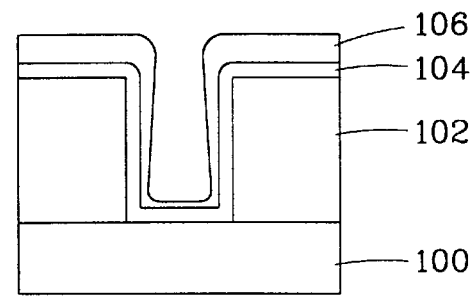
Figure 2D:
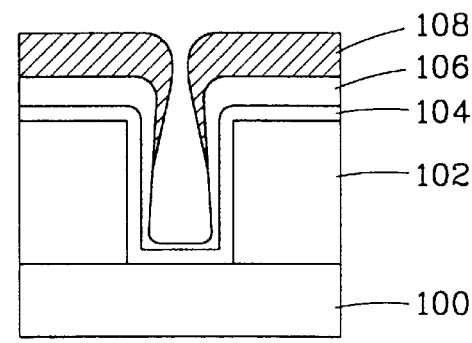
Figure 2E:
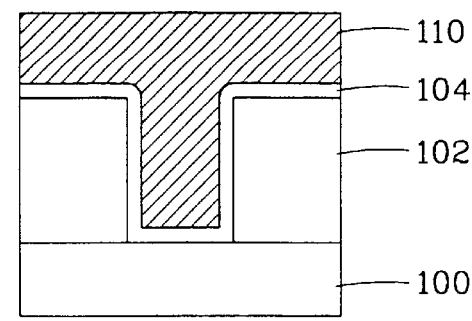

Next, the aluminum flowing process is performed, as shown in FIGS. 2C to 2E. The process includes two materials for aluminum wiring. One of the materials is a first aluminum alloy layer 106 which contains aluminum and at least one of Sc, V, Pd, Cu and Ti. The other is a second aluminum alloy layer 108 capable of flowing at a low temperature which contains aluminum and germanium. Here, the deposition of Al—Cu having a good characteristic of electromigration as the first aluminum alloy layer 106 will be described.

That is, as shown in FIG. 2C, the first aluminum alloy layer 106 containing Al—Cu is deposited as much as one fourth (¼) to two thirds (⅔) of the total thickness of the aluminum wiring, on the barrier layer 104 at a temperature of below 150° C. While, the second aluminum alloy layer 108 containing Al—Ge is deposited as much as the remaining thickness of three fourths (¾) (in case of depositing the first aluminum alloy layer 106 to one fourth of the total thickness of the aluminum wiring) to one third (⅓) (in case of depositing the first aluminum alloy layer by two thirds of the total thickness of the aluminum wiring) at a temperature below 150° C., as shown in FIG. 2D.

Thereafter, Al—Ge fills up the contact hole by annealing the substrate 100 at a temperature of above 300° C. on which the first and the second aluminum alloy layers 106 and 108 made of Al—Cu and Al—Ge are deposited, respectively. Cu which is diffused from the lower layer of Al—Cu while maintaining the substrate at a high temperature, is distributed evenly in the first and the second aluminum alloy layers 106 and 108 and an aluminum alloy wiring 110 of Al—Cu—Ge is finally formed as shown in FIG. 2E. In result, it is possible to enhance the characteristic of the electromigration of the wiring. At this time, the amount of Ge included in Al—Ge becomes 1 to 10 at/o of the aluminum alloy wiring.

On the other hand, comparing the first embodiment as with the second embodiment shown in FIGS. 3A–3D, a difference lies in filling up the contact hole by the aluminum flowing process. The process depicted in FIGS. 3A to 3C corresponds to the process depicted in FIG. 2A to FIG. 2C. The process for filling up the contact hole is hereinafter described.

Figure 3A:
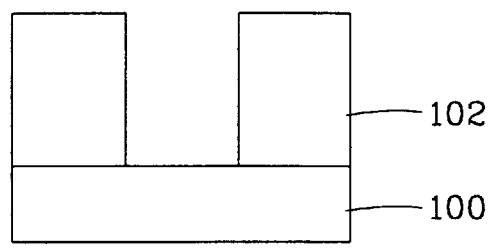
FIGS. 3A to 3D show a sequential process for fabricating the wiring of a semiconductor device in accordance with the second embodiment of the present invention.
Figure 3B:
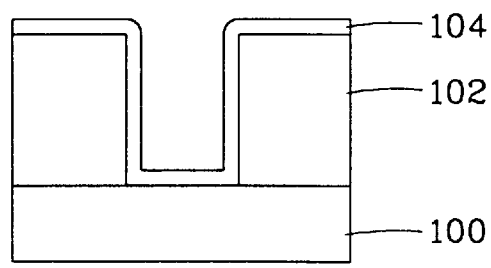
Figure 3C:
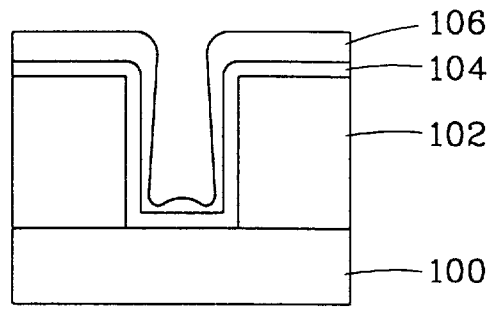
Figure 3D:
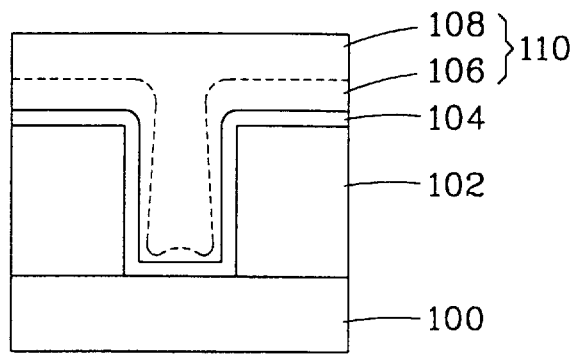

That is, the barrier 104 is formed on the semiconductor substrate 100 and the insulating film 102 having the contact hole. After forming Al—Cu on the barrier 104 as the first aluminum alloy layer 106 at a deposition temperature below 150° C. (as in the first embodiment) the substrate is annealed at a temperature of above 300° C. After annealing the substrate, by depositing Al—Ge of the second aluminum alloy layer 108, Cu which is diffused from the lower layer of Al—Cu while maintaining the substrate at a high temperature, is distributed evenly in the aluminum alloy layer, as illustrated in the first embodiment, and an aluminum alloy wiring 110 of Al—Cu—Ge is finally formed as shown in FIG. 3D. At this time, the amount of Ge included in Al—Ge becomes 1 to 10 at/o of the aluminum alloy wiring.

In result, the characteristic of the electromigration of the wiring in the second embodiment is improved, as illustrated in the first embodiment.

As hereinbefore described, according to the present invention, the desired method for fabricating the wiring of the semiconductor device can be achieved by performing the aluminum flowing process using the first aluminum alloy layer Al—Cu and the second aluminum alloy layer Al—Ge, and finally obtaining the aluminum alloy wiring, i.e., Al—Cu—Ge wiring. Accordingly, flowing at a low temperature which is the characteristic of Al—Ge wiring can be employed and also the characteristic of the electromigration of the wiring is improved.

What is claimed is:

1. A method for fabricating wiring of a semiconductor device, comprising the steps of:

depositing an insulating film on a semiconductor substrate so as to form a contact hole in the insulating film;

forming a barrier layer on the insulating film and the substrate;

depositing a first aluminum alloy layer on the barrier layer at a first temperature range of less than 150° C.;

depositing a second aluminum alloy layer containing Ge on the first aluminum alloy layer at a temperature range substantially the same as the first temperature range; and forming an aluminum alloy wiring by annealing the substrate on which the first and second aluminum alloy layers are formed, at a second temperature range of greater than 300° C., so as to merge the first aluminum alloy layer and the second aluminum alloy layer containing Ge.

2. The method of claim 1, wherein the first aluminum alloy layer includes aluminum and at least one of V, Pd, Sc, Cu and Ti.

3. The method of claim 1, wherein the amount of Ge included in said second aluminum alloy layer is 1 to 10 at/o of the aluminum alloy wiring.

4. The method of claim 3, wherein the first aluminum alloy layer includes aluminum and Sc.

5. The method of claim 1, wherein the aluminum alloy wiring is an AL—Cu—Ge alloy.

6. The method of claim 1, wherein the depositing step includes the steps of:

etching a portion of the insulating film, and forming the contact hole through the insulating film.

7. The method of claim 1, wherein the first aluminum alloy layer is an Al—Cu alloy, the second aluminum alloy layer is an Al—Ge alloy, and the aluminum alloy wiring is an Al—Cu—Ge alloy.

8. The method of claim 1, wherein the second aluminum alloy layer is deposited at a temperature range of less than 150° C.

9. A method for fabricating wiring of a semiconductor device, comprising the steps of:

depositing an insulating film on a semiconductor substrate so as to form a contact hole in the insulating film;

forming a barrier layer on the insulating film and the substrate;

depositing a first aluminum alloy layer on the barrier layer at a temperature range of less than 150° C.;

heating the substrate on which the first aluminum alloy layer is formed at a temperature range of greater than 300° C., prior to forming a second aluminum alloy layer; and depositing the second aluminum alloy layer containing Ge directly on the first aluminum alloy layer, the heating of the substrate continuing for a time period so that the first aluminum alloy layer and the second aluminum alloy layer containing Ge are merged to form an aluminum alloy wiring.

10. The method of claim 9, wherein the first aluminum alloy layer includes aluminum and at least one of V, Pd, Sc, Cu, and Ti.

11. The method of claim 9, wherein the amount of Ge included in said second aluminum alloy layer is 1 to 10 at/o of the aluminum alloy wiring.

12. The method of claim 11, wherein the first aluminum alloy layer includes aluminum and Sc.

13. The method of claim 9, wherein the depositing step includes the steps of:

etching a portion of the insulating film, and forming the contact hole through the insulating film.

14. The method of claim 9, wherein said aluminum alloy wiring is an Al—Cu—Ge alloy.

15. The method of claim 9, wherein the first aluminum alloy layer is an Al—Cu alloy, the second aluminum alloy layer is an Al—Ge alloy, and the aluminum alloy wiring is an Al—Cu—Ge alloy.

16. A method of fabricating wiring of a semiconductor device, comprising the steps of:

depositing an insulating film on a semiconductor substrate;

forming a contact hole through the insulating film;

forming a barrier layer on the insulating film and the semiconductor substrate;

forming a first metal alloy layer directly on the barrier layer;

forming a second metal alloy layer having Ge on the first metal alloy layer; and annealing the semiconductor substrate and thereby substantially filling the contact hole with a third metal alloy layer having Ge, wherein the first metal alloy layer is an Al—Cu alloy, the second metal alloy layer is an Al—Ge alloy, and the third metal alloy layer is an Al—Cu—Ge alloy, wherein the steps of forming the first and second metal alloy layers include the steps of depositing the Al—Cu alloy on the barrier layer at a temperature range of less than 150° C., and depositing the Al—Ge alloy on the Al—Cu alloy at a temperature range of less than 150° C., and wherein the annealing step includes the step of.

heating the semiconductor substrate at a temperature range of greater than 300° C., after said depositing steps.

* * * * *